United States Patent
Saraf et al.

(10) Patent No.: US 10,123,117 B1
(45) Date of Patent: Nov. 6, 2018

(54) INPUT IMPEDANCE BIASING

(71) Applicant: Cirrus Logic International Semiconductor Ltd., Edinburgh (GB)

(72) Inventors: Vivek Saraf, Austin, TX (US); Axel Thomsen, Austin, TX (US); Ravi Kummaraguntla, Austin, TX (US); John C. Tucker, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/586,023

(22) Filed: May 3, 2017

(51) Int. Cl.
*H04R 3/00* (2006.01)
*H04R 3/04* (2006.01)
*H03H 7/40* (2006.01)

(52) U.S. Cl.
CPC .............. *H04R 3/04* (2013.01); *H03H 7/40* (2013.01); *H04R 3/00* (2013.01); *H04R 2201/003* (2013.01)

(58) Field of Classification Search
CPC ........ H04R 3/00; H04R 19/04; H04R 23/004; H04R 3/04; H04R 2201/003; H03H 7/40; H03H 7/38
USPC .......................................... 381/111, 113, 114
See application file for complete search history.

(56) References Cited

U.S. PATENT DOCUMENTS

| | | | | |
|---|---|---|---|---|
| 6,737,912 B2 * | 5/2004 | Otsuka | ............... | H01L 27/0802 257/E27.047 |
| 6,838,957 B2 * | 1/2005 | Karanicolas | ......... | H03H 11/481 327/524 |
| 7,385,426 B1 * | 6/2008 | Wan | ................... | H03F 3/45179 326/115 |
| 2008/0290961 A1 * | 11/2008 | Abe | .................... | H01L 27/0805 333/32 |
| 2010/0246859 A1 | 9/2010 | David et al. | | |
| 2016/0099706 A1 * | 4/2016 | Lee | ...................... | H03K 17/687 327/109 |

FOREIGN PATENT DOCUMENTS

EP          2495995 A1        9/2012

* cited by examiner

*Primary Examiner* — Disler Paul
(74) *Attorney, Agent, or Firm* — Norton Rose Fulbright US LLP

(57) ABSTRACT

Input impedance biasing may be improved with an ultra-high-input-impedance biasing circuit having low temperature variation. The impedance biasing circuit may include a first transistor coupled to a first power supply and a second transistor coupled to a second power supply. A gate of the first transistor may be coupled to a gate of the second transistor at an intermediate bias node. The first transistor and the second transistor may provide a selected DC impedance at the intermediate bias node. The impedance may be used to provide low-pass and or high-pass filtering of audio signals and/or noise.

17 Claims, 8 Drawing Sheets

INPUT IMPEDANCE BIASING

FIELD OF THE DISCLOSURE

The instant disclosure relates to input impedance biasing. More specifically, portions of this disclosure relate to high input impedance biasing with low temperate variation.

BACKGROUND

The input and/or output impedances of integrated circuits typically need to be regulated to achieve a desired performance from the integrated circuits without signal degradation. For example, FIG. 1 is a schematic block diagram illustrating a conventional input impedance biasing circuit according to the prior art. In FIG. 1, a capacitor 102 may represent a portion of a microphone and be coupled to circuitry of an audio controller. A high impedance may be desired at input node 106 of additional circuitry 104. As illustrated in FIG. 1, a conventional system to provide high impedance at input node 106 includes an impedance string 110 that consists of a complementary string of polysilicon diodes connected in anti-series. Depending on the impedance provided by impedance string 110, a start-up switch 112 may be included to initialize the input node 106 to a desired voltage, such as $VCM_{in}$.

Numerous drawbacks are associated with conventional input impedance biasing circuits, such as impedance string 110. For example, the impedance provided at input node 106 by impedance string 110 may vary significantly across operating temperatures. The variation may make it difficult for audio controller 100 to meet different specifications, such as linearity and signal to noise ratio (SNR).

Shortcomings mentioned here are only representative and are included simply to highlight that a need exists for improved electrical components, particularly for improved input impedance biasing circuits. Embodiments described herein address certain shortcomings but not necessarily each and every one described here or known in the art.

SUMMARY

Input impedance biasing may be improved through use of an impedance source having low temperature variation. A high impedance may be created with at least two transistors coupled together. The gate current of each of the transistors may be controlled to use the transistors as resistors. Specifically, the leakage current of the transistors may be controlled to obtain a gate current that allows the transistors to be used as resistors. In one example, one terminal of a transistor resistor may be the gate of the transistor and the other terminal of the transistor resistor may be the coupled-together drain and source terminals of the transistors. The provided impedance may be configured by coupling devices in series or parallel to obtain different resistance values. The impedance may also be configured by adjusting the design parameters of the transistor in the structure, such as their lengths, widths, or electrochemical properties to obtain different resistance values. In addition, the voltages applied to the terminals of the transistors may also be modified to obtain different resistance values.

The gate current variation exhibited by transistors across a particular temperature range may be designed to be low. For example, the gate current variation exhibited by transistors between a "hot" temperature of 125° C. and a "cold" temperature of −40° C. may be less than or equal to 50 percent. Therefore, the variation of the resistance provided by transistor resistors that rely on gate current to create the resistance may also be less than or equal to 50 percent across a "hot" temperature of 125° C. and a "cold" temperature of −40° C.

According to one embodiment, an apparatus may include a bias circuit configured to provide an impedance. The bias circuit may include a first transistor coupled to a first power supply and a second transistor coupled to a second power supply. A gate of the first transistor may be coupled to a gate of the second transistor at an intermediate bias node. The first transistor and the second transistor may provide a selected DC impedance at the intermediate bias node.

In another embodiment, a method includes: providing an impedance at an intermediate bias node; low-pass filtering, with the impedance provided at the intermediate bias node, noise from a terminal at which a direct current (DC) signal is applied; and high-pass filtering, with the impedance provided at the intermediate bias node, a signal from a terminal at which an alternating current (AC) signal is applied. The impedance may be provided with a bias circuit that includes a first transistor coupled to a first power supply and a second transistor coupled to a second power supply. A gate of the first transistor may be coupled to a gate of the second transistor at an intermediate bias node. The first transistor and the second transistor may provide a selected DC impedance at the intermediate bias node. A controller may be configured in software or hardware to perform this method or similar methods.

In yet another embodiment, an apparatus may include an audio controller configured to perform steps that include: providing an impedance at an intermediate bias node; low-pass filtering, with the impedance provided at the intermediate bias node, noise from a terminal at which a direct current (DC) signal is applied; and high-pass filtering, with the impedance provided at the intermediate bias node, a signal from a terminal at which an alternating current (AC) signal is applied. The impedance may be provided with a bias circuit that includes a first transistor coupled to a first power supply and a second transistor coupled to a second power supply. A gate of the first transistor may be coupled to a gate of the second transistor at an intermediate bias node. The first transistor and the second transistor may provide a selected DC impedance at the intermediate bias node. The controller may be configured in software or hardware to perform this method or similar methods.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed systems and methods, reference is now made to the following descriptions taken in conjunction with the accompanying drawings. In the appended figures, similar components or features may have the same reference label. Further, various components of the same type may be distinguished by following the reference label with a second label that distinguishes among the similar components. If just the first reference label is used in the specification, the description is applicable to any one of the similar components having the same first reference label irrespective of the second reference label.

DETAILED DESCRIPTION

Figure 1:
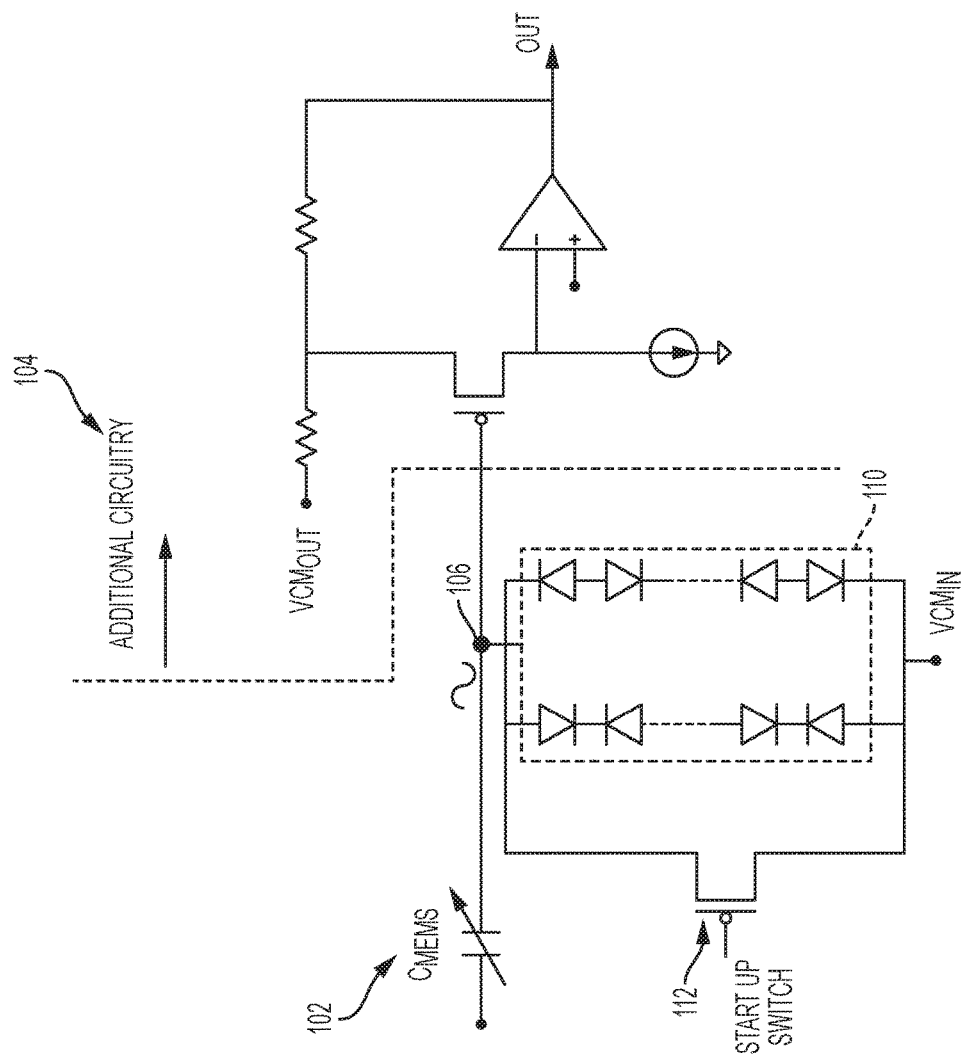
FIG. 1 is a schematic block diagram illustrating a conventional input impedance biasing circuit according to the prior art.
Figure 2:
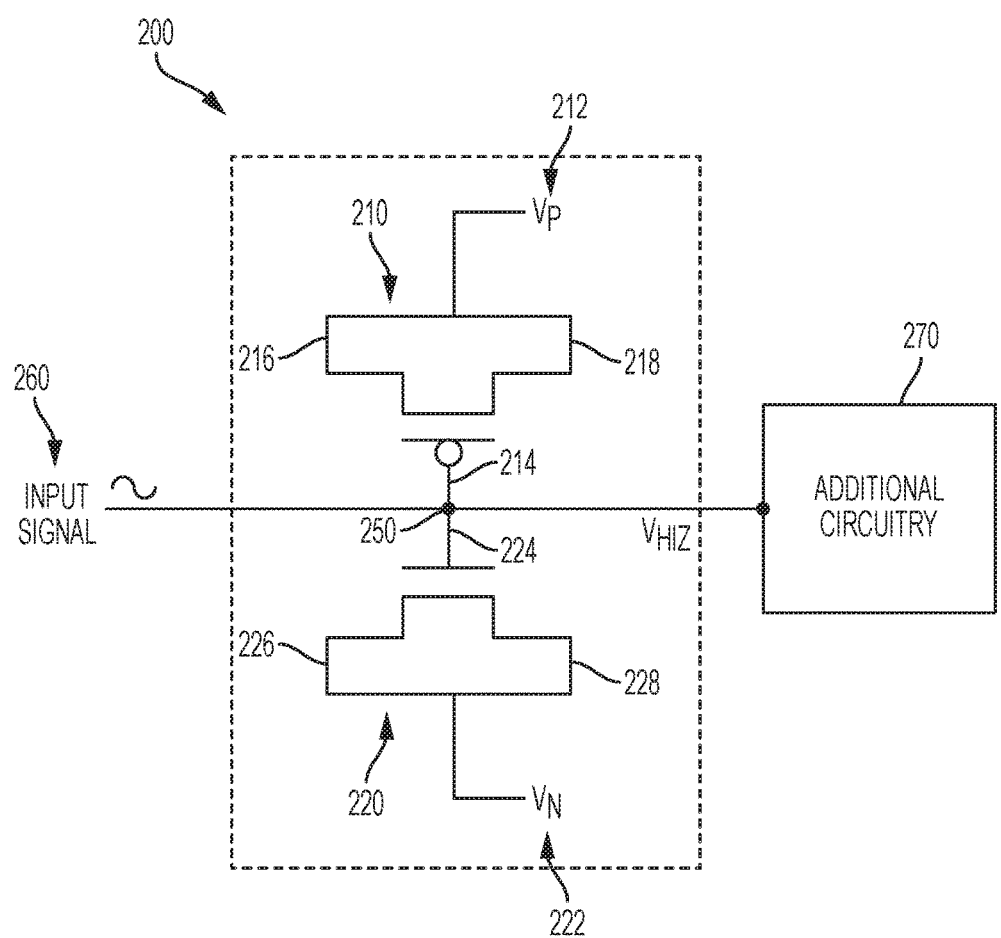
FIG. 2 is a schematic block diagram illustrating an example high impedance biasing circuit according to some embodiments of the disclosure.

FIG. 2 is a schematic block diagram illustrating an example high impedance biasing circuit 200 according to some embodiments of the disclosure. The high impedance biasing circuit 200 may be implemented as (or within) a controller integrated circuit (IC), such as with an audio coder/decoder (CODEC) within a personal device. As illustrated in FIG. 2, an input signal 260 may be received at input node 250. The input signal 260 may be a voltage signal received from a microphone either directly or after some processing by other components. Additional circuitry 270 may also be included within an audio CODEC to process the input signal present at input node 250. Additional circuitry 270 may include circuitry that processes audio signals.

Bias circuit 200 may be configured to provide an impedance at input node 250. Bias circuit 200 may include a first transistor 210 coupled to a first power supply 212. Bias circuit 200 may also include a second transistor 220 coupled to a second power supply 222. The first transistor 210 may be a p-channel transistor ("PMOS transistor") or an n-channel transistor ("NMOS transistor"). Similarly, second transistor 220 may be a PMOS transistor or a NMOS transistor. In one embodiment, first transistor 210 is a PMOS transistor and second transistor 220 is a NMOS transistor. In some embodiments, each of first power supply 212 and second power supply 222 may be a terminal through which energy may be transferred from other components, such as a controller power supply or a battery.

In the bias circuit 200, a gate 214 of the first transistor 210 may be coupled to a gate 224 of the second transistor 220 at an intermediate bias node, such as input node 250. The first transistor 210 and the second transistor 220 may provide a selected direct-current (DC) impedance at the intermediate bias node 250. The selected DC impedance provided by bias circuit 200 may range from as low as mega-ohms to as high as tera-ohms or exa-ohms.

The terminals of a drain 216 and a source 218 of the first transistor 210 may be coupled together and to the first power supply 212. Similarly, a drain 226 and a source 228 of the second transistor 220 may be coupled together and to the second power supply 222. A selected DC impedance may be provided at a junction between the gate 214 of the first transistor 210 and the gate 224 of the second transistor 220 and a source/drain 216/218 of the first transistor 210 and a source/drain 226/228 of the second transistor 220, respectively. The selected DC impedance may be provided by the parallel impedance combination of the impedance provided by the first transistor 210 between the input node 250 and the source/drain terminal 216/218 of the first transistor 210 and the impedance provided by the second transistor 220 between the input node 250 and the source/drain terminal 226/228 of the second transistor 220.

Figure 3:
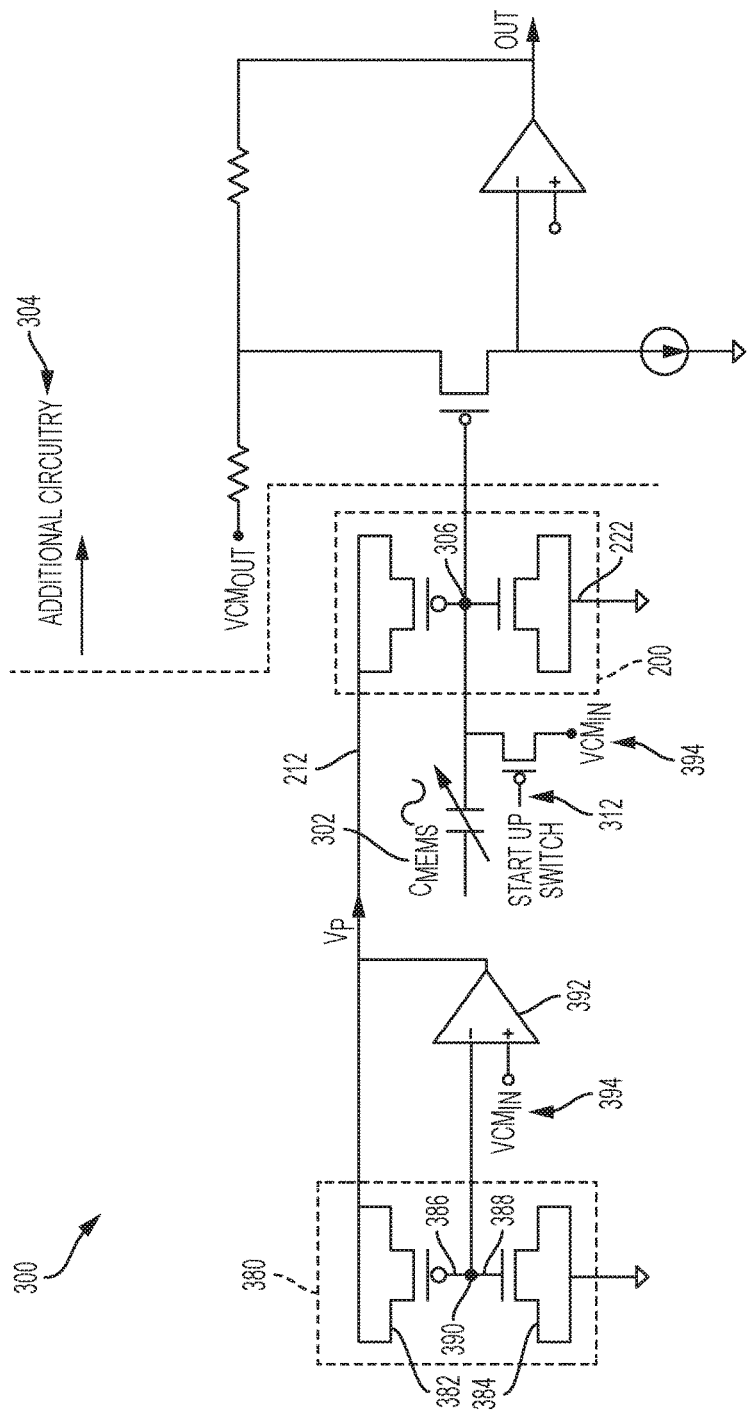
FIG. 3 is a schematic block diagram illustrating an example high impedance biasing circuit with voltage and/or impedance control according to some embodiments of the disclosure.

The voltage and/or impedance at input node 250 may be controlled. FIG. 3 is a schematic block diagram illustrating an example high impedance biasing circuit with voltage and/or impedance control according to some embodiments of the disclosure. In FIG. 3, a capacitor 302 may represent a microphone and be coupled to circuitry 304 of an audio controller 300 through impedance biasing circuit 200. A start-up switch 312 may be included to initialize input node 306 to a desired voltage, such as input voltage $VCM_{IN}$ 394. A high impedance may be desired at input node 306 and provided with high impedance biasing circuit 200.

Voltage control of biasing circuit 200 illustrated in FIG. 3 may be provided through the use of a feedback loop. A feedback loop may be included in audio controller 300 and may be configured to control an intermediate bias node voltage of biasing circuit 200, such as the voltage at input node 306. The feedback loop may include a replica bias circuit 380. Replica bias circuit 380 may include a third transistor 382 coupled to first power supply 212 of biasing circuit 200. Replica bias circuit 380 may also include a fourth transistor 384 coupled to second power supply 222 of biasing circuit 200. The parameters of the third transistor 382 and fourth transistor 384, such as their widths, lengths, and electrochemical properties, may be substantially similar to the first transistor 210 and second transistor 220, respectively. To further replicate the behavior of the first transistor 210 and the second transistor 220, the gate 386 of the third transistor 382 may be coupled to a gate 388 of the fourth transistor 384 at a replica bias node 390. An operational amplifier 392 may be coupled to replica bias node 390 and may be configured to control the first power supply 212 to obtain a desired input voltage 394 at the replica bias node 390. In some embodiments, the operational amplifier 392 or additional operational amplifiers (not shown) may be configured to control the first power supply 212 and the second power supply 222. Control of both power supplies may be used to obtain control over voltage and impedance at intermediate bias nodes, as described in further detail below.

Such control of replica bias circuit 380 by operational amplifier 392 to obtain an input voltage 394 at replica bias node 390 may also control biasing circuit 200 to obtain a voltage at input node 306 that is substantially similar to input voltage 394. For example, because the replica bias circuit 380 is designed to substantially replicate biasing circuit 200, and because the power supplies 212 and 222 couple to both the biasing circuit 200 and replica bias circuit 380 in the same way, a voltage present at replica bias node 390 may be substantially equal to a voltage present on input node 306. Therefore, by controlling replica bias circuit 380 to obtain an input voltage 394 at replica bias node 390, a voltage substantially equal to input voltage 394 may also be set at input node 306.

In operation, in order to control the voltage at input node 306 through control of biasing circuit 200, operational amplifier 392 may control the voltage at replica bias node 390 through control of replica bias circuit 380. For example, input voltage 394 may be applied to an input terminal of operational amplifier 392 to set the voltage at replica bias node 390 to input voltage 394. That is, the operational amplifier 392 may control the first power supply 212 to obtain input voltage 394 at replica bias node 390. Because replica bias circuit 380 is a replica of bias circuit 200, controlling, by the operation amplifier 392, the first power supply 212 to obtain input voltage 394 at replica bias node 390 also controls the first power supply 212 coupled to bias circuit 200 to obtain input voltage 394 at input node 306.

The feedback loop may be configured to track variation in the audio controller 300 to modify first power supply 212 as needed to maintain the voltage at input node 306 at a value approximately equal to input voltage 394. For example, the feedback loop may be configured to detect a voltage representative of the voltage at the intermediate bias node of bias circuit 200, such as input node 306. Because the operational amplifier 392 is coupled to replica bias node 390, the detection of the voltage representative of the voltage at input node 306 may be performed by the operational amplifier 392 through its detection of the voltage at replica bias node 390 because the voltage at replica bias node 390 may be a voltage representative of the voltage at input node 306. Upon detecting the voltage at replica bias node 390, the feedback loop, through operational amplifier 394, may control the first power supply 212 to set an intermediate bias node 306 of bias circuit 200 to the input voltage 394 based on the detected voltage at replica bias node 390.

Figure 4:
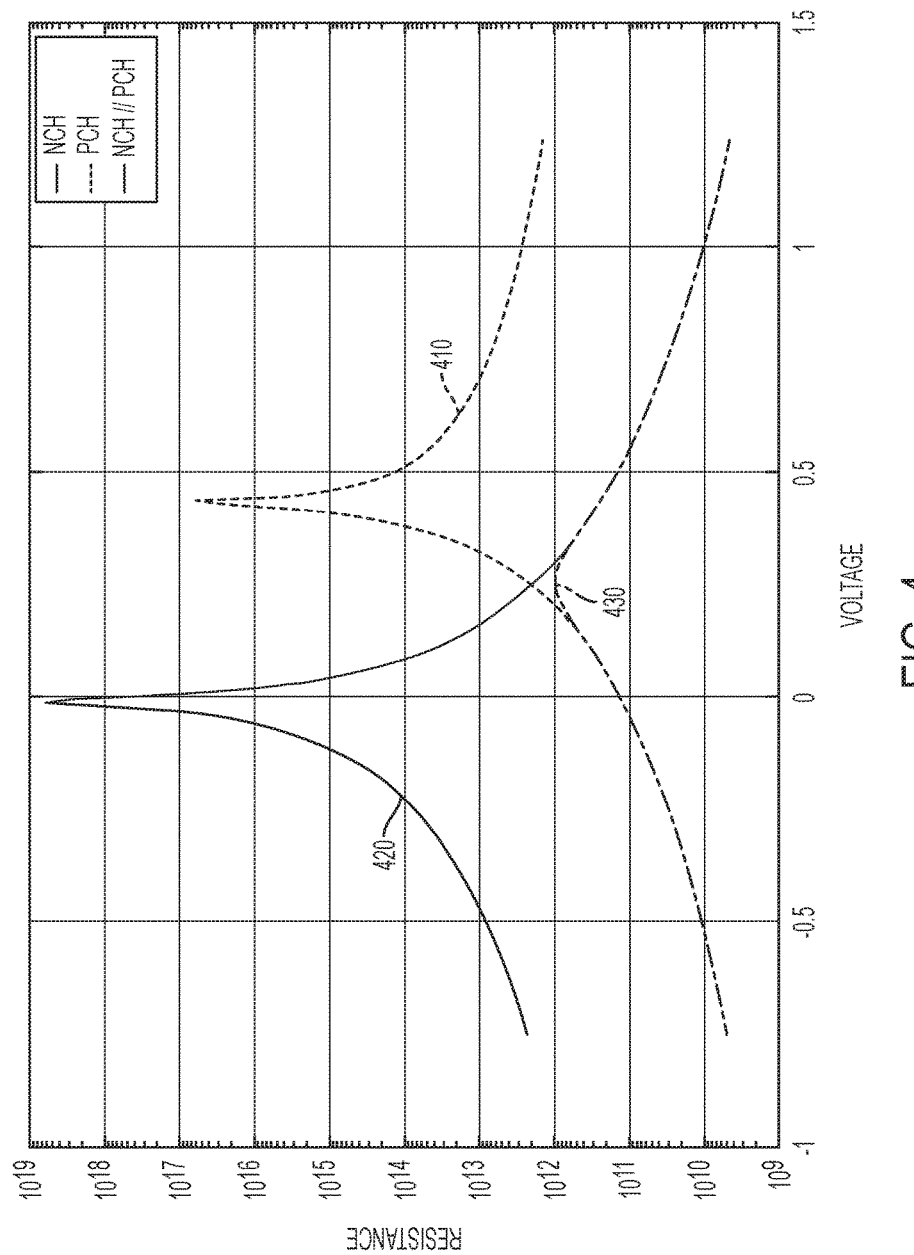
FIG. 4 is a plot illustrating the relationship between resistance and voltage in an example high impedance biasing circuit according to some embodiments of the disclosure.

FIG. 4 is a plot illustrating the relationship between resistance and voltage in an example high impedance biasing circuit according to some embodiments of the disclosure. FIG. 4 illustrates that the DC impedance provided by biasing circuit 200 may also be controlled. For example, in FIG. 4 the vertical axis represents increasing resistance and the horizontal axis represents increasing voltage. Resistance plot 410 may correspond to a resistance provided by a PMOS transistor, such as first transistor 210 illustrated in FIGS. 2-3. Resistance plot 420 may correspond to a resistance provided by a NMOS transistor, such as second transistor 220 illustrated in FIGS. 2-3. Input impedance plot 430 may correspond to the parallel combination of resistances 410 and 420. Therefore, in the embodiments illustrated in FIGS. 2-3, the impedance at input nodes 250 and 306 may be represented in FIG. 4 as input impedance 430. The voltage corresponding to the horizontal axis may correspond to VCMin input voltage 394.

The impedance presented at input node 306 may be controlled based on the value of input voltage 394 according to the plots of FIG. 4. The maximum impedance is achieved when input voltage 394 has a value approximately equal to 0.25 V. In other embodiments, the voltage where the maximum resistance is achieved may be a different voltage and may depend on the design parameters of the transistors in bias circuit 200. As illustrated in the plot 430 of FIG. 4, as input voltage 394 decreases or increases from the voltage where the maximum resistance is achieved, the resistance present at input node 306 decreases. By changing the value of input voltage 394, the value of impedance present at input node 306 may also change accordingly such that the impedance present at input node 306 may be controlled by input voltage 394.

Returning to FIG. 3, impedance control of biasing circuit 200 illustrated in FIG. 3 may be provided through the use of a feedback loop in some embodiments. The feedback loop described with respect to FIG. 3 for voltage control may be configured to also or alternatively control the DC impedance provided at input node 306. In particular, control of replica bias circuit 380 by operational amplifier 392 to obtain an input voltage 394 at replica bias node 390 may also control biasing circuit 200 to obtain a desired DC impedance at input node 306. In order to control the DC impedance provided at input node 306 through control of biasing circuit 200, operational amplifier 392 may control the voltage at replica bias node 390 through control of replica bias circuit 380. For example, as illustrated in FIG. 3, input voltage 394 may be applied to an input terminal of operational amplifier 392 to set the voltage at replica bias node 390 to input voltage 394. That is, the operational amplifier 392 may control the first power supply 212 to obtain input voltage 394 at replica bias node 390. Because replica bias circuit 380 is a replica of bias circuit 200, controlling the first power supply 212 to obtain input voltage 394 at replica bias node 390 also controls the first power supply 212 coupled to bias circuit 200 to obtain input voltage 394 at input node 306. The DC impedance present at input node 306 may be a function of the voltage present at input node 306. Thus, the first power supply 212 may be controlled to obtain input voltage 394 at input node 306 and controlled to obtain a selected DC impedance at input node 306.

The feedback loop may be configured to track variation in the audio controller 300 to modify first power supply 212 as needed to maintain the voltage at input node 306 at a value substantially equal to input voltage 394 so as to control the impedance present at input node 306. For example, the feedback loop may be configured to detect a voltage at replica bias node 390 that may be representative of the voltage at the intermediate bias node of bias circuit 200, such as input node 306. Upon detecting the voltage at replica bias node 390 that is representative of the voltage at input node 306, the feedback loop, through operational amplifier 394, may control the first power supply 212 to set an intermediate bias node of bias circuit 200, such as input node 306, to the input voltage 394 based on the detected voltage at replica bias node 390, thereby also setting the impedance present at input node 306 to a selected DC impedance value.

The impedance provided at intermediate bias node 306 may be used to high-pass filter a signal from a terminal at which an alternating current (AC) signal is applied. For example, as illustrated in FIG. 3, capacitor 302 may represent an acoustic transducer of a MEMS microphone. The MEMS microphone 302 may generate an AC signal representative of audio received from the environment around the microphone 302. When the impedance provided by biasing circuit 200 is combined with capacitor 302, a high-pass filter may be created and the high-pass filter may have a corner frequency at a selected frequency for filtering the input audio voltage signal. In other words, the selected DC impedance provided by bias circuit 200 may have an impedance value that may be combined with a capacitance of an attached device, such as capacitor 302, to create a high-pass filter with a corner at a selected frequency, such as an audible frequency, for filtering the input audio voltage signal.

The impedance provided at intermediate bias node 306 may alternatively be used to low-pass filter noise from a terminal at which a DC signal is applied. For example, the DC signal may include the signals applied at first power supply 212 and/or second power supply 222. When the impedance provided by biasing circuit 200 is combined with capacitance 302, a low-pass filter may be created and the low-pass filter may filter noise present at first power supply 212 and/or second power supply 222.

Figure 5:
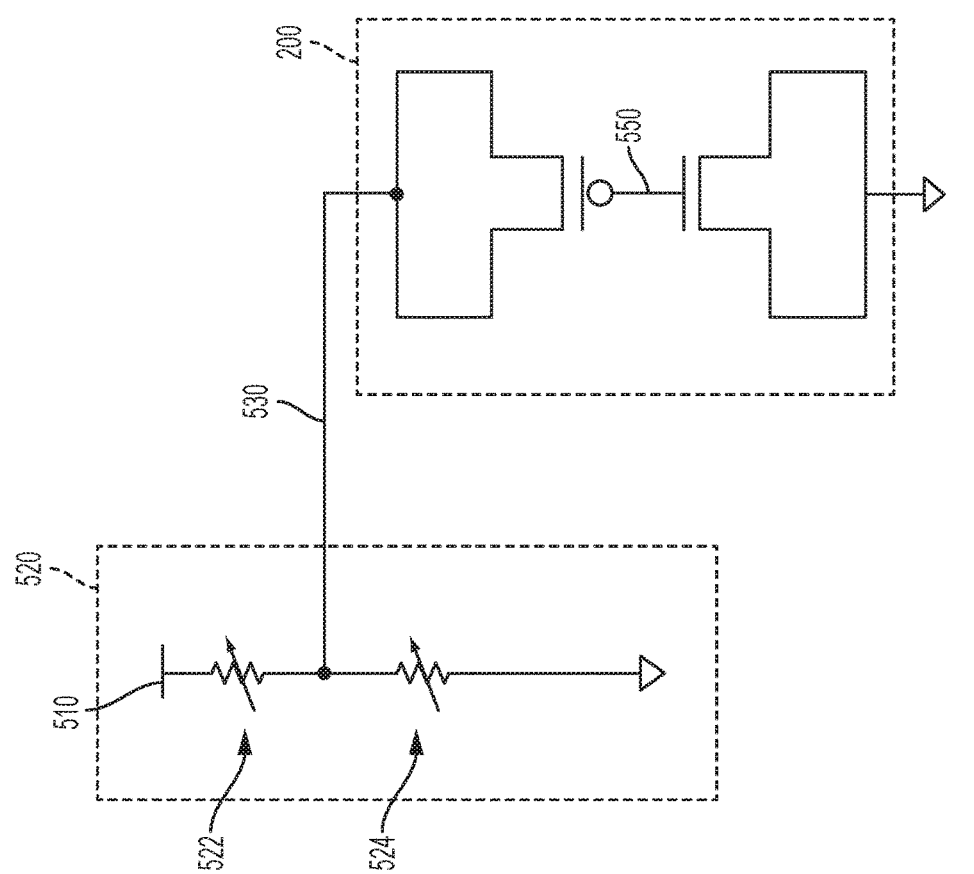
FIG. 5 is a schematic block diagram illustrating another example high impedance biasing circuit with voltage and/or impedance control according to some embodiments of the disclosure.

FIG. 5 is a schematic block diagram illustrating another example high impedance biasing circuit with voltage and/or impedance control according to some embodiments of the disclosure. In particular, FIG. 5 illustrates an embodiment in which a replica bias circuit is not used to provide voltage and/or impedance control of biasing circuit 200. Voltage and/or impedance control may be provided with control block 520. Control block includes a first variable resistor 522 and second variable resistor 524. Variable resistors 522 and 524 may be controlled to set node 530 to a specific voltage. For example, variable resistors 522 and 524 may create a voltage divider that can be adjusted to set node 530 to a voltage between power supply 510 and ground. By setting node 530 to a specific voltage, control block 520 may control the first power supply of bias circuit 200 to set an intermediate bias node 550 of bias circuit 200 to a specific voltage between the voltage at node 530 and ground. Therefore, the voltage at intermediate bias node 550 may be controlled and set based on the voltage at node 530, which in turn may be controlled and set based on the values of variable resistors 522 and 524 in control block 520. Similarly, because the DC impedance present at node 550 may be a function of the voltage present at node 550, as is illustrated in FIG. 4, controlling the first power supply 530 coupled to bias circuit 200 to set intermediate bias node 550 of bias circuit 200 to a specific voltage may also control bias circuit 200 to set a selected DC impedance at node 550. Therefore, the impedance at intermediate bias node 550 may also be controlled and set based on the voltage at node 530, which in turn may be controlled and set based on the values of variable resistors 522 and 524 in control block 520.

Figure 6:
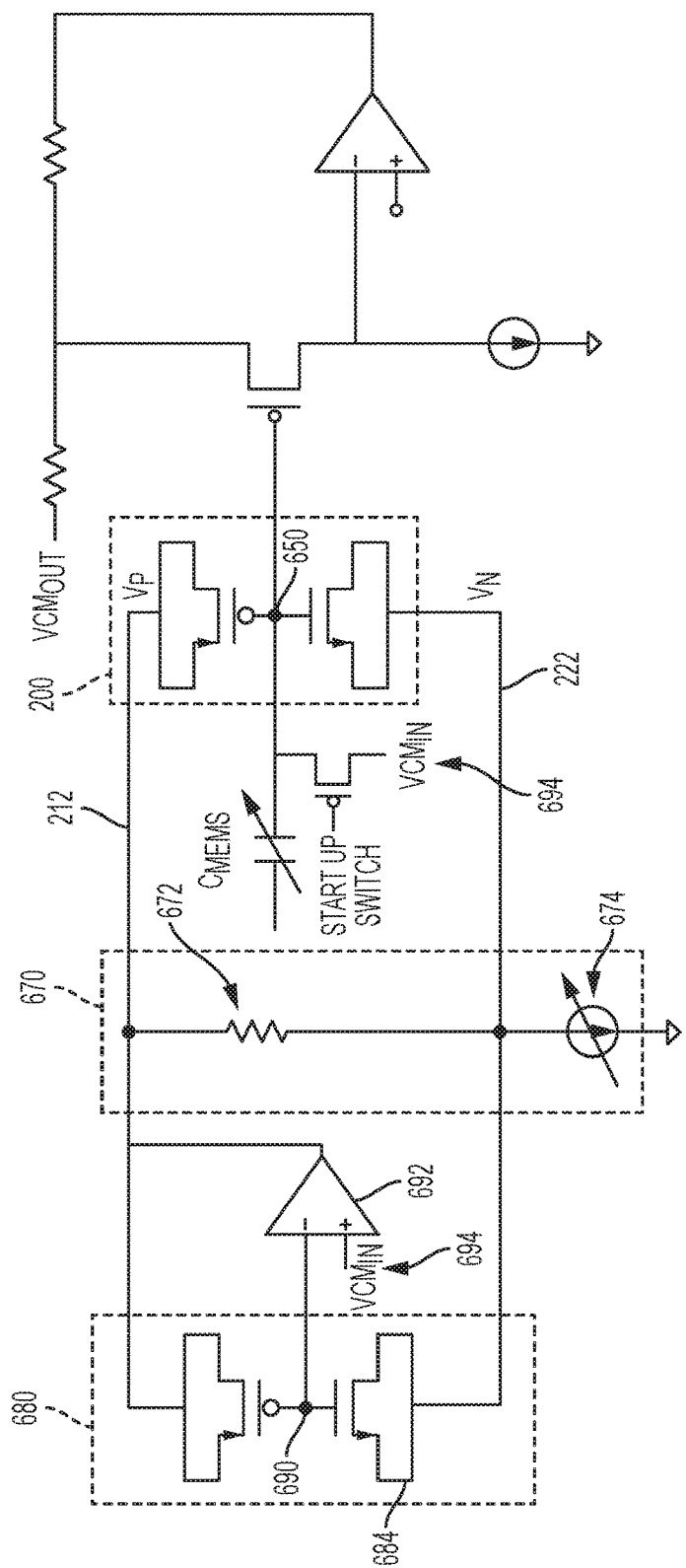
FIG. 6 is a schematic block diagram illustrating an example high impedance biasing circuit with voltage control and impedance control according to some embodiments of the disclosure.

FIG. 6 is a schematic block diagram illustrating an example high impedance biasing circuit with voltage control and impedance control according to some embodiments of the disclosure. The biasing circuit illustrated in FIG. 6 may be configured similar to, and may operate similar to, the biasing circuit illustrated in FIG. 3. In FIG. 6, the second power supply 222 of biasing circuit 200 is coupled to the source and drain of fourth transistor 684 of replica bias circuit 680. In addition, another biasing branch 670 that includes a resistor 672 and a variable current source 674 is coupled to first power supply 212 and to second power supply 222 to provide additional voltage and impedance control of biasing circuit 200. Specifically, the resistor 672 may have one of its terminals coupled to first power supply 212 and may have its other terminal coupled to second power supply 222. With the addition of biasing branch 670, the voltages on both the first power supply 212 and the second power supply 222 and the impedance between the first power supply 212 and the second power supply 222 may be controlled to control the voltage and/or impedance present at intermediate bias node 650. The operational amplifier 692 may be configured to control the second power supply 222 to obtain an input voltage 694 at the replica bias node 690 as well as to obtain the input voltage 694 and a specific resistance at intermediate bias node 650.

Figure 7:
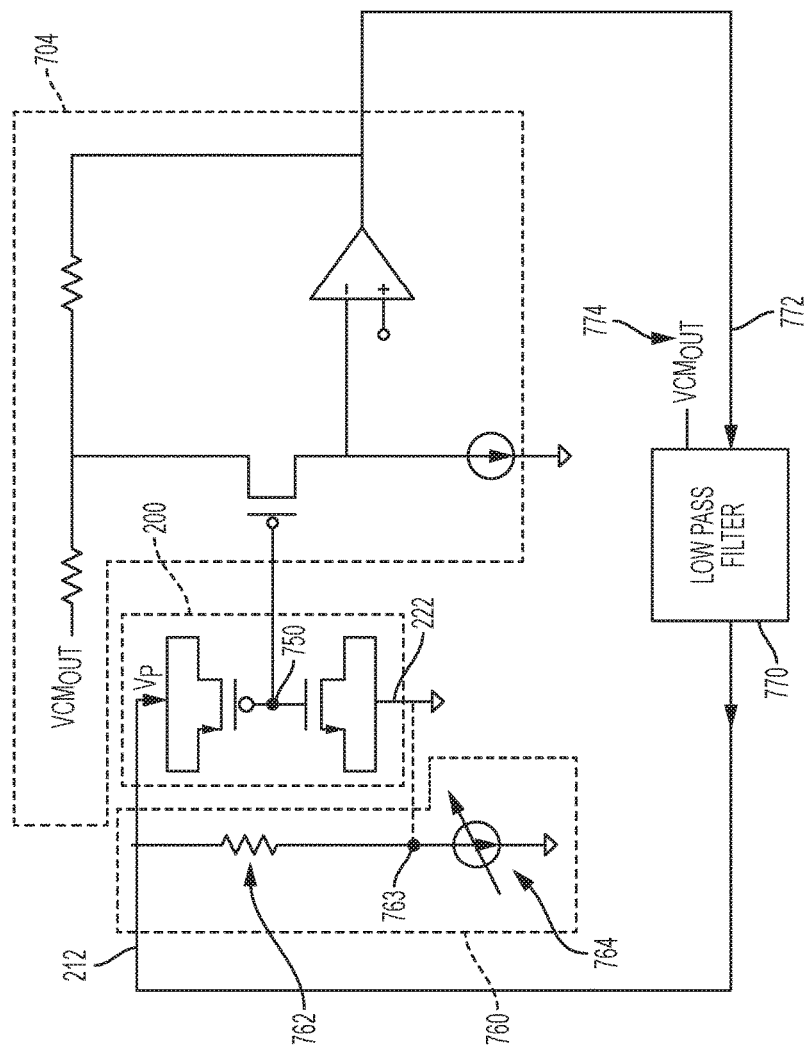
FIG. 7 is a schematic block diagram illustrating another example high impedance biasing circuit with voltage control and impedance control according to some embodiments of the disclosure.

FIG. 7 is a schematic block diagram illustrating another example high impedance biasing circuit with voltage control and impedance control according to some embodiments of the disclosure. Voltage and/or impedance control may be provided with low-pass filter (LPF) 770. LPF 770 may receive as a first input an output voltage signal 772 from an additional circuitry block 704. LPF 770 may also receive as a second input another voltage signal, such as VCMout voltage signal 774. LPF 770 may process output signal 772 and voltage signal 774 to control first power supply 212 of bias circuit 200. LPF 770 may be configured to set first power supply 212 to a specific voltage based on output signal 772 and voltage signal 774. By setting first power supply 212 to a specific voltage, LPF 770 may control the first power supply 212 of bias circuit 200 to set an intermediate bias node 750 of bias circuit 200 to a specific voltage between the voltage at first power supply 212 and ground. Therefore, the voltage at intermediate bias node 750 may be controlled and set based on the voltage at first power supply 212, which in turn may be controlled and set based on the processing performed by LPF 770 on output signal 772 and voltage signal 774. Similarly, because the DC impedance present at node 750 may be a function of the voltage present at node 750, as is illustrated in FIG. 4, controlling the first power supply 212 coupled to bias circuit 200 to set intermediate bias node 750 of bias circuit 200 to a specific voltage may also control bias circuit 200 to set a selected DC impedance at node 750. Therefore, the impedance at intermediate bias node 750 may also be controlled and set based on the voltage at first power supply 212, which in turn may be controlled and set based on the processing performed by LPF 770 on output signal 772 and voltage signal 774.

Another biasing branch 760 may also be included along with LPF 770 to provide additional voltage and impedance control of bias circuit 200. Biasing branch 760 may include a resistor 762 and a variable current source 764. The resistor 762 may have one terminal coupled to first power supply 212 and may have another terminal coupled to second power supply 222. The current source 764 may be coupled to second power supply 222 and to ground. In this configuration, the second power supply 222 is not coupled to ground, and is instead coupled to terminal 763 of biasing branch 760. With the addition of biasing branch 760, the voltages on both the first power supply 212 and the second power supply 222 and the impedance between the first power supply 212 and the second power supply 222 may be controlled to control the voltage and/or impedance present at intermediate bias node 750.

Figure 8:
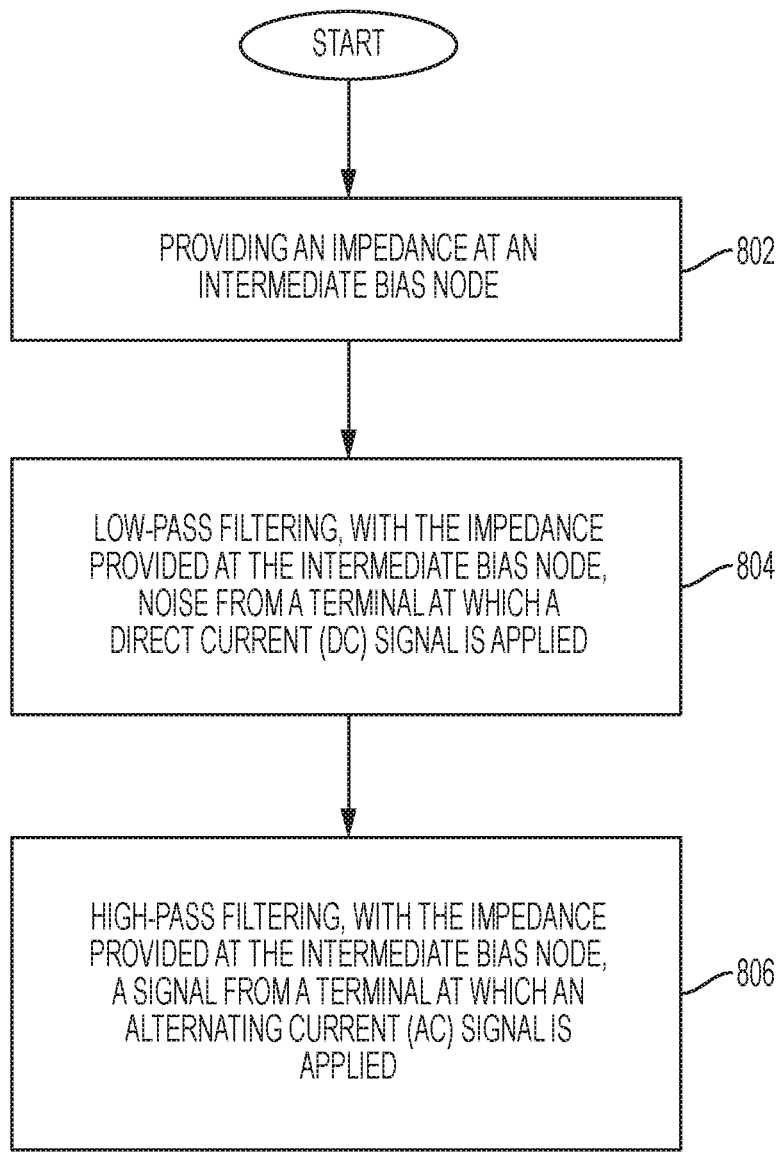
FIG. 8 is a flow chart illustrating an example method for providing a high impedance according to one embodiment of the disclosure.

FIG. 8 is a flow chart illustrating an example method for providing an ultra-high input impedance with an ultra-high-input-impedance biasing circuit according to one embodiment of the disclosure. Method 800 may be implemented with the systems described with respect to FIGS. 2-7 or other systems. Method 800 begins, at block 802, with providing an impedance at an intermediate bias node. In some embodiments, the impedance may be provided with a bias circuit. The bias circuit may include a first transistor coupled to a first power supply and a second transistor coupled to a second power supply. A gate of the first transistor may be coupled to a gate of the second transistor at the intermediate bias node. The first transistor and the second transistor may provide a selected DC impedance at the intermediate bias node between the first power supply and the second power supply.

At block 804, method 800 includes low-pass filtering, with the impedance provided at the intermediate bias node, noise from a terminal at which a direct current (DC) signal is applied. At block 806, method 800 includes high-pass filtering, with the impedance provided at the intermediate bias node, a signal from a terminal at which an alternating current (AC) signal is applied.

In some embodiments, the provided DC impedance may be controlled with a feedback loop, for example as illustrated in FIGS. 3-7. According to some embodiments, the step of controlling the provided DC impedance may include replicating the process of providing the selected DC impedance with a third transistor and a fourth transistor coupled to a replica bias node, and controlling the first power supply to control the selected DC impedance based, at least in part, on a voltage at the replica bias node, for example as illustrated in FIGS. 3 and 6. In other embodiments, an input audio voltage signal may be received from a MEMS microphone, and the step of providing the impedance may create a high-pass filter with a corner at an audible frequency for filtering the input audio signal from the MEMS microphone.

The schematic flow chart diagram of FIG. 8 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding methods. Indeed, some arrows or other connectors may be used to indicate only the logical flow of the methods. For instance, an arrow may indicate a waiting or monitoring period of unspecified duration between enumerated steps of the depicted methods. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although impedance-providing bias circuits are described in embodiments above, aspects of the disclosed invention may also be applied to other bias circuits. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
 a bias circuit configured to provide an impedance, the bias circuit comprising:
  a first transistor coupled to a first power supply;
  a second transistor coupled to a second power supply,
   wherein a gate of the first transistor is coupled to a gate of the second transistor at an intermediate bias node,
   wherein the first transistor and the second transistor provide a selected DC impedance at the intermediate bias node, and
   wherein the provided DC impedance is a controlled DC impedance; and
  a feedback loop configured to control the provided DC impedance based, at least in part, on a voltage representative of the voltage at the intermediate bias node.

2. The apparatus of claim 1, wherein a drain and a source of the first transistor are coupled together and to the first power supply, and wherein a drain and a source of the second transistor are coupled together and to the second power supply.

3. The apparatus of claim 1, wherein the selected DC impedance is provided by a junction between the gate of the first transistor and the gate of the second transistor and a source/drain of the first transistor and a source/drain of the second transistor, respectively.

4. The apparatus of claim 1, wherein the feedback loop is configured to detect a voltage representative of the voltage at the intermediate bias node and control the first power supply to set the intermediate bias node to an input voltage based on the detected voltage.

5. The apparatus of claim 1, wherein the feedback loop comprises:
 a replica bias circuit comprising:
  a third transistor coupled to the first power supply; and
  a fourth transistor coupled to the second power supply,
   wherein a gate of the third transistor is coupled to a gate of the fourth transistor at a replica bias node; and
 an operational amplifier coupled to the replica bias node and configured to control the first power supply to obtain an input voltage at the replica bias node.

6. The apparatus of claim 5, wherein the operational amplifier is further configured to control the second power supply to obtain the input voltage at the replica bias node.

7. The apparatus of claim 1, wherein the selected DC impedance has an impedance value that is combined with a capacitance of an attached device to create a high-pass filter with a corner at a selected frequency for filtering the input voltage.

8. The apparatus of claim 1, further comprising a feedback loop configured to control an intermediate bias node voltage at the intermediate bias node, wherein the feedback loop is configured to detect a voltage representative of the voltage at the intermediate bias node and control the first power supply to set the intermediate bias node to an input voltage based on the detected voltage.

9. The apparatus of claim 1, wherein an input voltage is received from a MEMS microphone, and wherein the selected DC impedance has an impedance value that when combined with a capacitance of an attached device creates a high-pass filter with a corner at an audible frequency for filtering an input audio signal from the MEMS microphone.

10. A method, comprising:
providing an impedance at an intermediate bias node, wherein the impedance is provided with a bias circuit that comprises:
a first transistor coupled to a first power supply; and
a second transistor coupled to a second power supply,
wherein a gate of the first transistor is coupled to a gate of the second transistor at the intermediate bias node, and
wherein the first transistor and the second transistor provide a selected DC impedance at the intermediate bias node between the first power supply and the second power supply;
low-pass filtering, with the impedance provided at the intermediate bias node, noise from a terminal at which a direct current (DC) signal is applied; and
high-pass filtering, with the impedance provided at the intermediate bias node, a signal from a terminal at which an alternating current (AC) signal is applied.

11. The method of claim 10, further comprising controlling the provided DC impedance with a feedback loop.

12. The method of claim 11, wherein the step of controlling the provided DC impedance comprises:
replicating the process of providing the selected DC impedance with a third transistor and a fourth transistor coupled to a replica bias node; and
controlling the first power supply to control the selected DC impedance based, at least in part, on a voltage at the replica bias node.

13. The method of claim 10, further comprising receiving an input audio signal from a MEMS microphone, wherein the step of providing the impedance creates a high-pass filter with a corner at an audible frequency for filtering the input audio signal from the MEMS microphone.

14. An apparatus, comprising:
an audio controller configured to perform steps comprising:
providing an impedance at an intermediate bias node, wherein the impedance is provided with a bias circuit that comprises:
a first transistor coupled to a first power supply; and
a second transistor coupled to a second power supply,
wherein a gate of the first transistor is coupled to a gate of the second transistor at the intermediate bias node, and
wherein the first transistor and the second transistor provide a selected DC impedance at the intermediate bias node between the first power supply and the second power supply;
low-pass filtering, with the impedance provided at the intermediate bias node, noise from a terminal at which a direct current (DC) signal is applied; and
high-pass filtering, with the impedance provided at the intermediate bias node, a signal from a terminal at which an alternating current (AC) signal is applied.

15. The apparatus of claim 14, wherein the controller is further configured to perform the step of controlling the provided DC impedance with a feedback loop.

16. The apparatus of claim 15, wherein the step of controlling the provided DC impedance comprises:
replicating the process of providing the selected DC impedance with a third transistor and a fourth transistor coupled to a replica bias node; and
controlling the first power supply to control the selected DC impedance based, at least in part, on a voltage at the replica bias node.

17. The apparatus of claim 14, wherein the controller is further configured to perform the step of receiving an input audio signal from a MEMS microphone, wherein the step of providing the impedance creates a high-pass filter with a corner at an audible frequency for filtering the input audio signal from the MEMS microphone.

* * * * *